(12) United States Patent
Pan

(10) Patent No.: US 7,673,637 B2
(45) Date of Patent: Mar. 9, 2010

(54) PHOTOMASK CLEANER

(76) Inventor: Yung-Shun Pan, No. 9, Lane 380, Sec. 3, Hsi-Wan Road, Hsichih City, Taipei Hsien (TW)

( * ) Notice: Subject to any disclaimer, the term of this patent is extended or adjusted under 35 U.S.C. 154(b) by 374 days.

(21) Appl. No.: 11/889,376

(22) Filed: Aug. 13, 2007

(65) Prior Publication Data

US 2008/0041429 A1 Feb. 21, 2008

(30) Foreign Application Priority Data

Aug. 15, 2006 (TW) .............................. 95129999 A

(51) Int. Cl.
*B08B 3/02* (2006.01)
(52) U.S. Cl. ..................... 134/78; 134/200; 134/902
(58) Field of Classification Search ............... 134/78, 134/200, 902; 294/93, 86.26
See application file for complete search history.

(56) References Cited

U.S. PATENT DOCUMENTS

| | | | |
|---|---|---|---|
| 6,063,208 A * | 5/2000 | Williams | 134/34 |
| 6,427,703 B1 * | 8/2002 | Somekh | 134/1.1 |
| 6,635,390 B1 * | 10/2003 | Badger et al. | 430/5 |
| 6,676,800 B1 * | 1/2004 | Festa et al. | 156/345.1 |
| 6,734,443 B2 * | 5/2004 | Zheng et al. | 250/492.1 |
| 7,008,487 B1 * | 3/2006 | Hedges et al. | 134/33 |
| 7,209,220 B2 * | 4/2007 | Puerto et al. | 355/75 |

FOREIGN PATENT DOCUMENTS

| | | | |
|---|---|---|---|
| JP | 05-281707 | * | 10/1993 |
| JP | 11-109606 | * | 4/1999 |
| JP | 2006-091667 | * | 4/2006 |

* cited by examiner

*Primary Examiner*—Frankie L Stinson
(74) *Attorney, Agent, or Firm*—Ming Chow; Sinorica, LLC

(57) ABSTRACT

A photomask cleaner includes a clamp assembly using clamping plates with an elastic buffer device for clamping a photomask to be cleaned positively, a displacement mechanism for moving the clamp assembly among workstations subject to a predetermined track, a cleaning unit installed in one workstation for cleaning the photomask carried by the clamp assembly, and an air dryer installed in one workstation for drying the well-cleaned photomask carried.

15 Claims, 9 Drawing Sheets

PHOTOMASK CLEANER

BACKGROUND OF THE INVENTION

1. Field of the Invention

The present invention relates to a cleaning apparatus and more particularly, to a photomask cleaner, which cleans the photomask automatically and, which holds the photomask positively for cleaning and will not release the photomask in case of a power failure during the cleaning operation.

2. Description of the Related Art

As the world entered the $21^{st}$ century, the digital era begins to change human life. Digitalized high-tech products such as computer, digital TV, digital audio and video apparatus, building control system and many other digitalized products have been continuously developed to bring convenience to people. These high-tech products commonly use an IC chip for operation control. Therefore, some people asserted that IC chip is a mother of the industry. An IC chip is a miniaturized electronic circuit consisting of semiconductor devices and passive components. IC chips are fabricated with a photomask in clean environment in a layer process, which includes imaging, deposition and etching process steps. The plant and equipments for the fabrication of IC chips or wafers are quite expensive. The yield rate determines the profitability of a wafer foundry. Therefore, every semiconductor supplier is trying hard to improve their yield rate.

Contamination of photomask is an important factor that affects the yield rate of the fabrication of wafers. If particles appear on a photomask, the use of this contaminated photomask in semiconductor lithography will cause wafer defects. In order to keep a photomask clean, a pellicle will be used above the photomask to protect the photomask against particles. The pellicle is supported on a frame and spaced above the photomask at a distance to collect particles.

Before delivery to the client or the performance of a lithography process, the photomask must be scanned to check the pattern. In case of a defect, the pellicle must be removed from the photomask, and then the photomask must be cleaned in an acid trough. During the cleaning operation, SPM solution is used to remove big organic molecules, and SCI solutions is used to remove small organic molecules and particles. Thereafter, deionized water is used to remove residual cleaning solution from the photomask. After cleaning, a new pellicle is placed on the well-cleaned photomask. Because a pellicle is an expensive device. Removing a contaminated pellicle from a photomask and replacing a photomask with a new pellicle greatly increases the photomask using cost. Further, the glue used in a photomask is generally prepared from esters (RCO-OR)x, for example, polyacrylate. When a photomask is dipped in SPM solution, (RCOOR)x is dehydrated into gel-like (RCOOR)x that floats on water but not soluble in water. Dehydrolysis of (RCOOR)x may cause defects on the pattern of the photomask. Therefore, a photomask must be thrown away when cleaned three times. Because a photomask is quite expensive and cannot be used repeatedly for more many times, the cost of photomask utilization is high.

Therefore, it is desirable to provide a way that solve the aforesaid problem.

SUMMARY OF THE INVENTION

The present invention has been accomplished under the circumstances in view. It is the main object of the present invention to provide a photomask cleaner, which uses a clamp assembly with clamping plates and an elastic buffer device for picking up a photomask to be cleaned positively without causing a significant impact on the photomask. It is another object of the present invention to provide a photomask cleaner, which holds the photomask positively in position for cleaning and prevents falling of the photomask in case of a power failure.

It is still another object of the invention to provide a photomask cleaner, which uses a cleaning unit to clean the photomask and an air dryer to dry the well-cleaned photomask automatically.

To achieve these and other objects of the present invention, the photomask cleaner comprises a chamber operably set between an opened status and an enclosed airtight status; a worktable provided inside the chamber, the worktable carrying a plurality of workstations, a photomask lifter mounted inside the chamber and operable to move a photomask vertically to between a standby position and a clamping position; a clamp assembly mounted in the chamber and controllably to pick up the photomask from the clamping position; a displacement mechanism mounted in the chamber and controllable to move the clamp assembly among the workstations and the clamping position subject to a predetermined track; at least one cleaning unit installed in at least one of the workstations for cleaning the photomask carried by the clamp assembly, the at least one cleaning unit each comprising a plurality of spray nozzles controllable to spray a cleaning fluid to clean the photomask carried by the clamp assembly, a drain hole for drainage of the cleaning fluid, and a wiper for wiping clean the photomask carried by the clamp assembly; at least one air dryer installed in at least one of the workstations for drying the photomask carried by the clamp assembly with air; and a air circulation system installed in the chamber and controllable to supply a clean gas in the chamber and to carry foul air out of the chamber.

DETAILED DESCRIPTION OF THE PREFERRED EMBODIMENT

Figure 1:
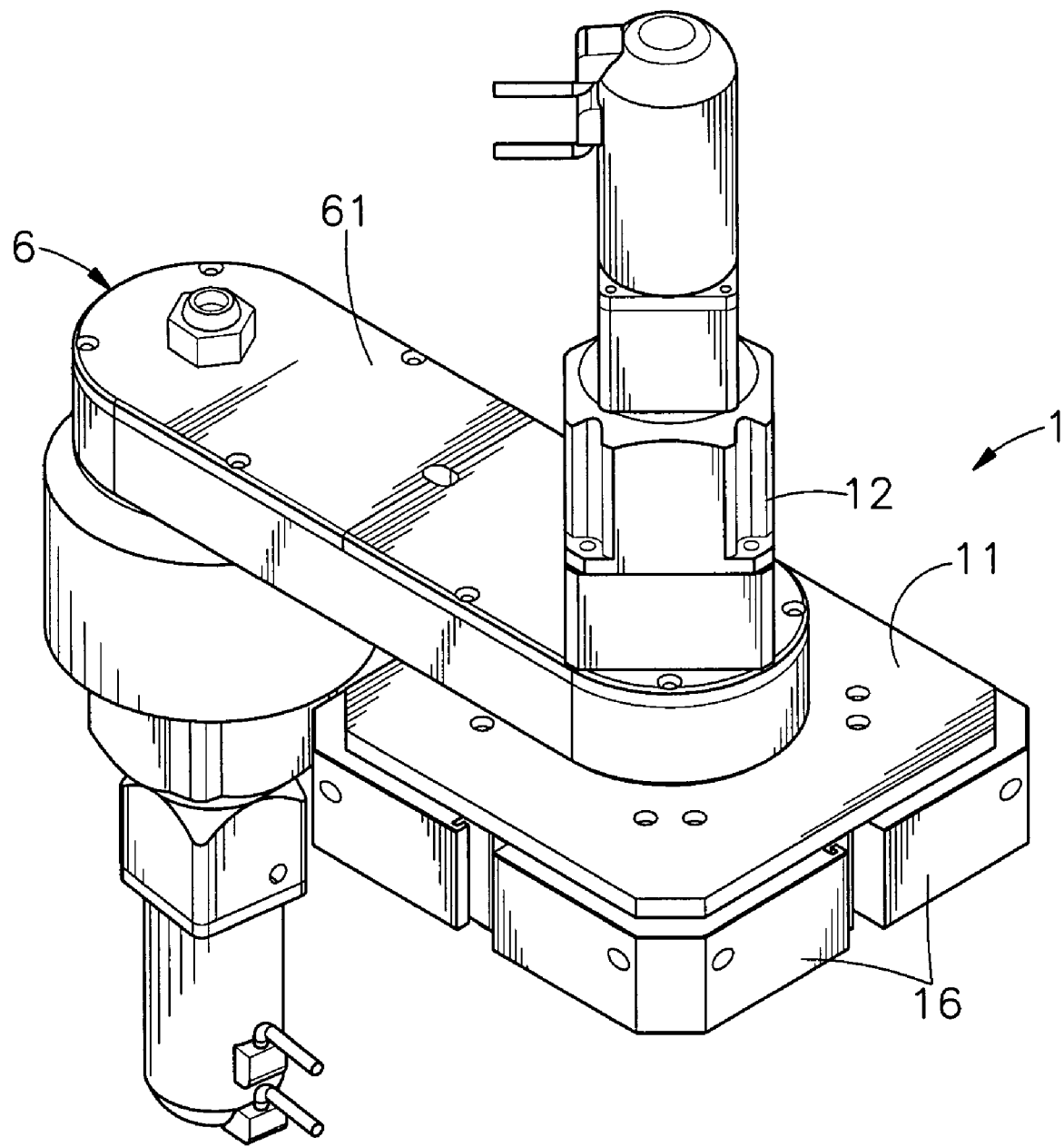
FIG. 1 is an elevational assembly view of a clamp assembly and a displacement mechanism for use in a photomask cleaner according to the present invention.
Figure 2:
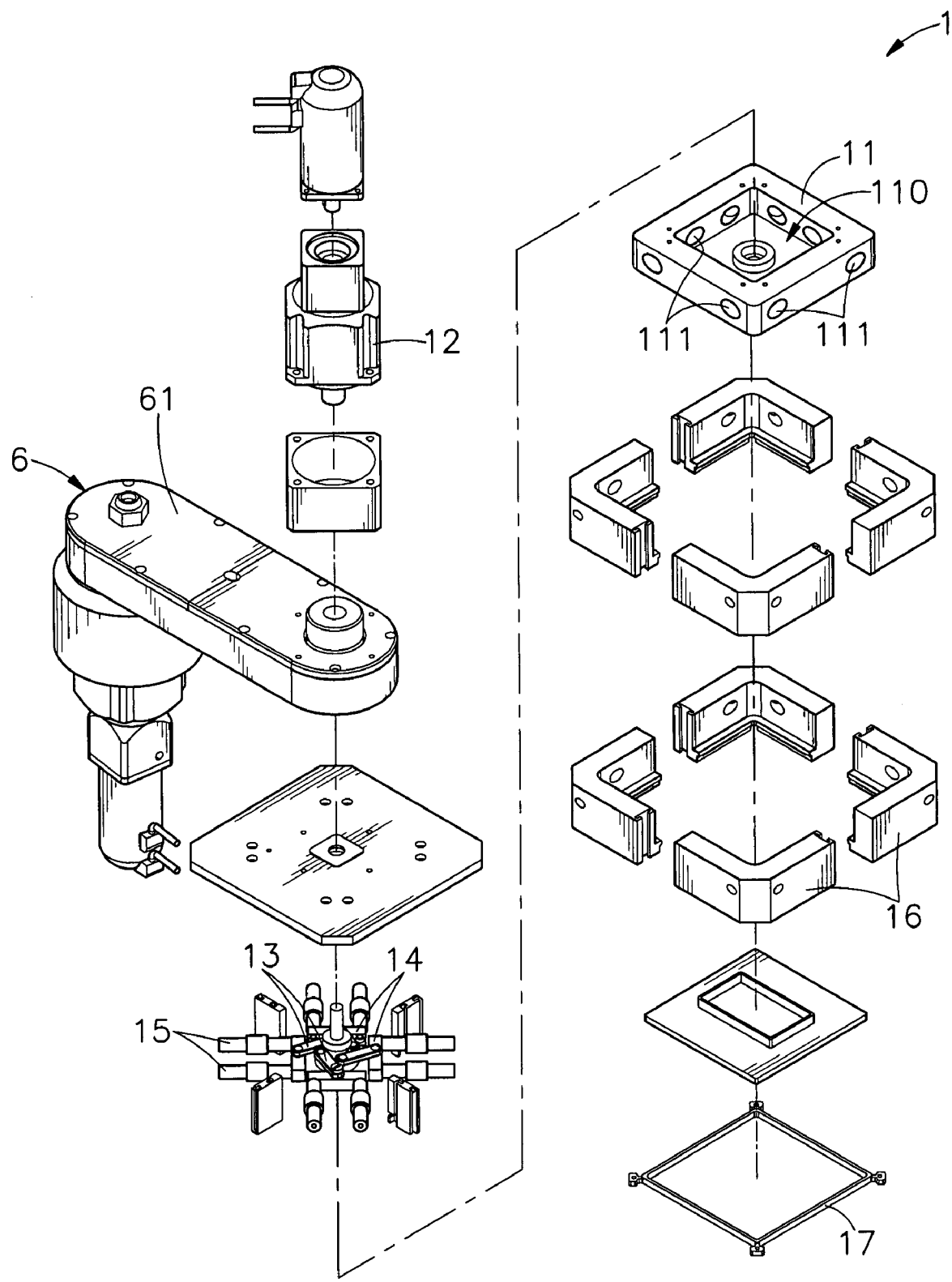
FIG. 2 is an exploded view of the clamp assembly and the displacement mechanism according to the present invention.

Referring to FIGS. 1 and 2, a photomask cleaner in accordance with the present invention is shown comprising a clamp assembly 1. The clamp assembly 1 comprises a holder base 11, which has a receiving portion 110 and a plurality of pairs of through holes 111 in communication with the receiving portion 110, a rotary driving device 12 accommodated in the receiving portion 110, a plurality of connecting members 14 suspending in the receiving portion 110 and equiangularly spaced around the rotary driving device 12, pairs of actuating rods 15 respectively connected to the distal ends of the connecting members 14 and respectively movably inserted through the through holes 111 to the outside of the holder base 11, a plurality of links 13 each having one end respectively tangentially pivoted to the rotary driving device 12 and the other end respectively pivotally coupled to the midpoint of each of the connecting members 14, a plurality of clamping plates 16 respectively connected to the pairs of actuating rods 15 outside the holder base 11, and an elastic buffer device 17 fastened to the clamping plates 16 for touching a photomask 2 to be cleaned to lower the impact on the photomask 2 when the clamping plates 16 clamp the photomask 2. The photomask cleaner further comprises a displacement mechanism 6 adapted to move the clamp assembly 1 subject to a predetermined track. The displacement mechanism 6 comprises a suspension arm 61 connected to the holder base 11 and operable to move the clamp assembly 1. When rotating the rotary driving device 12, the links 13 are forced to move the connecting members 14, thereby causing the actuating rods 15 to move the clamping plates 16 inwards/outwards relative to the holder base 11 between the received position to clamp the photomask 2 or the extended position to release the photomask 2.

Figure 3:
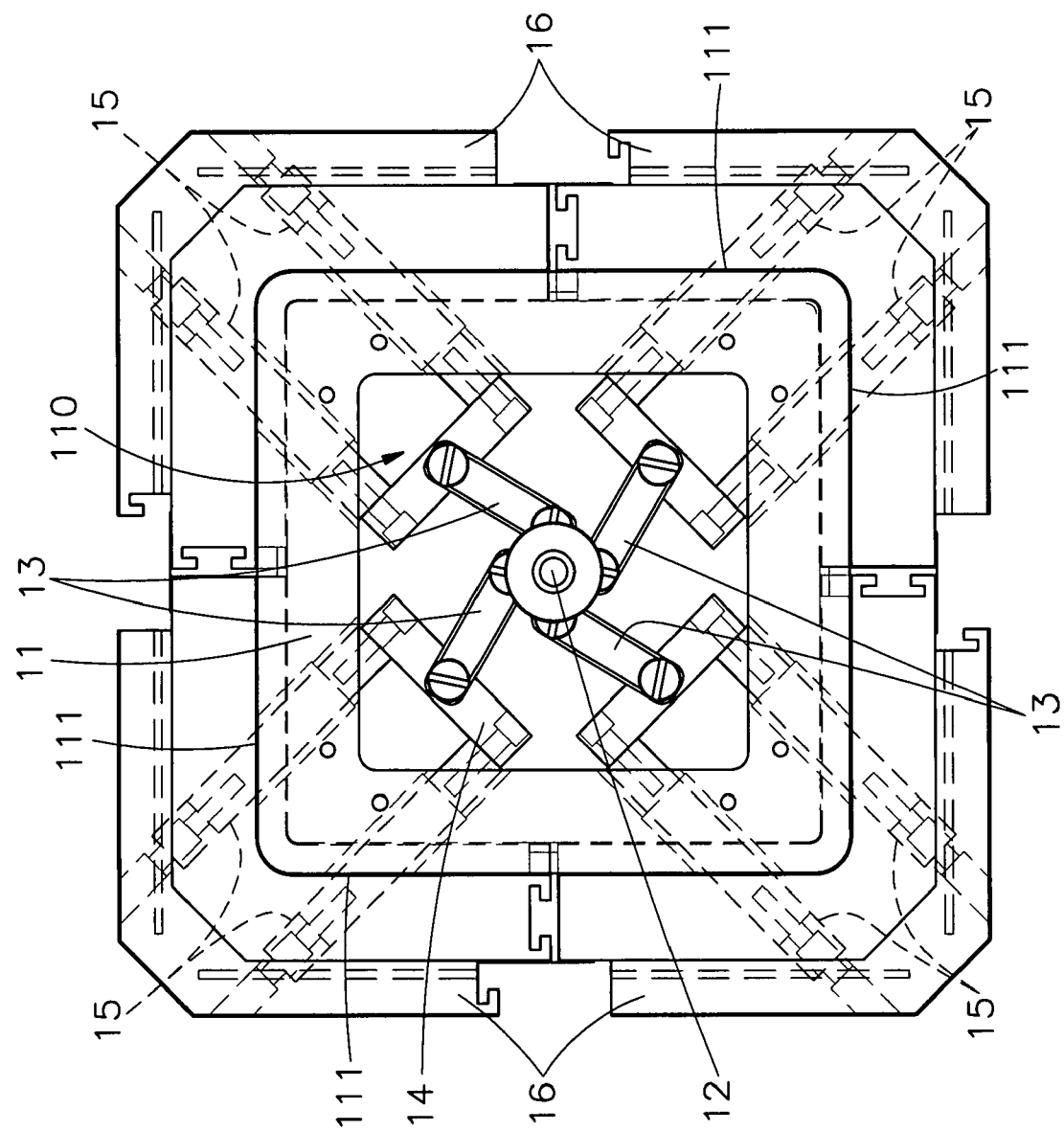
FIG. 3 is a schematic top view of the clamp assembly of the present invention.
Figure 4:
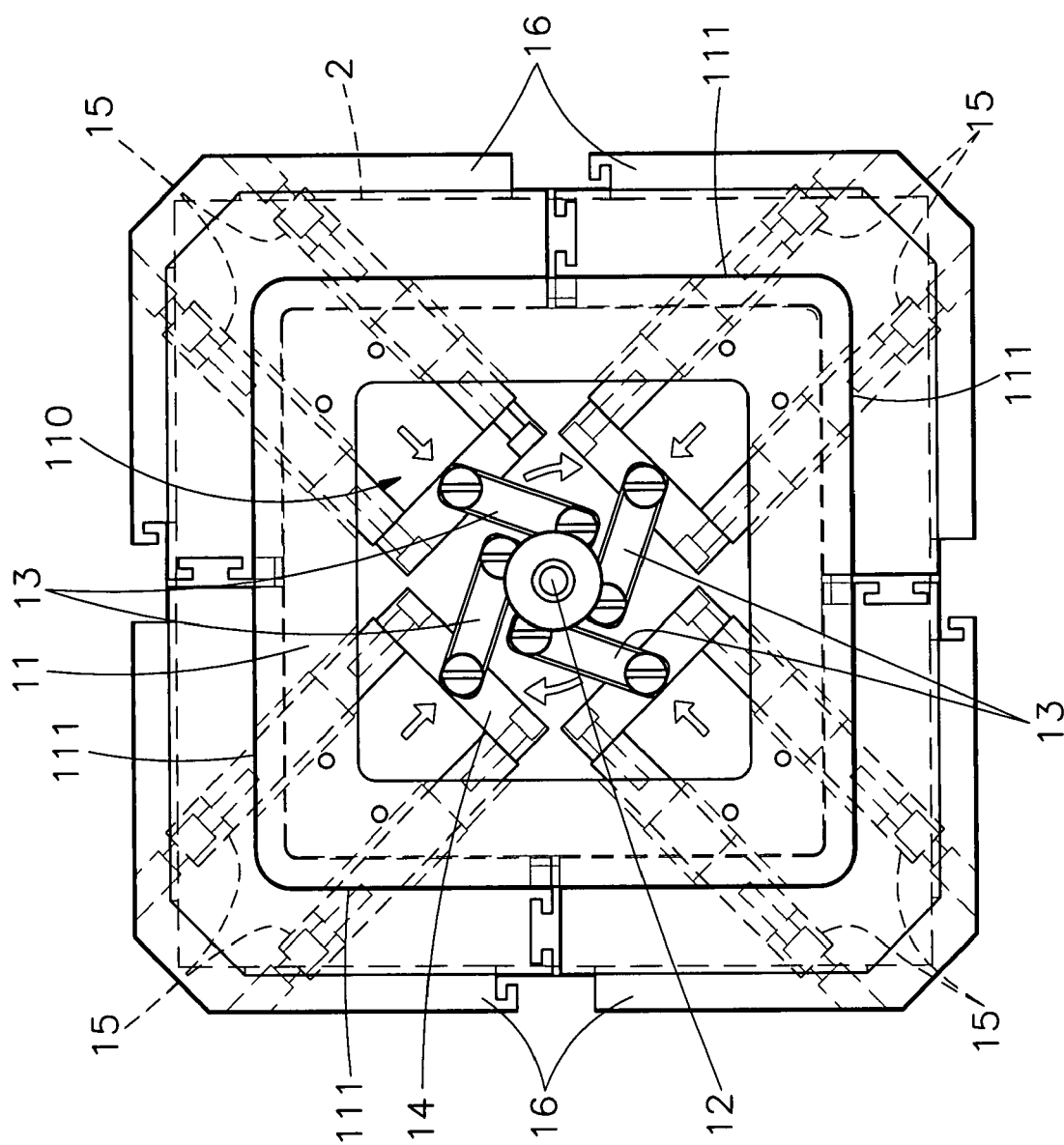
FIG. 4 corresponds to FIG. 3, showing clamping plates of the clamp assembly secured a photomask.

Referring to FIGS. 3 and 4, when the rotary driving device 12 is rotated in one direction to move the links 13 tangentially outwards, the clamping plates 16 are forced by the connecting members 14 through the actuating rods 15 to move outwards to the extended position where the distance between each two opposite clamping plates 16 is greater than the diameter of the photomask 2. Thus, the photomask 2 can be set in the space surrounded by the clamping plates 16. Thereafter, the rotary driving device 12 is rotated in the reversed direction to move the links 13 tangentially inwards, thereby causing the clamping plates 16 to be moved inwards by the connecting members 14 through the actuating rods 15 to the received position to clamp the photomask 2 for cleaning. In case of power failure at this time, the clamping plates 16 still kept in position, i.e., the photomask 2 does not fall from the clamping plates 16.

Figure 5:
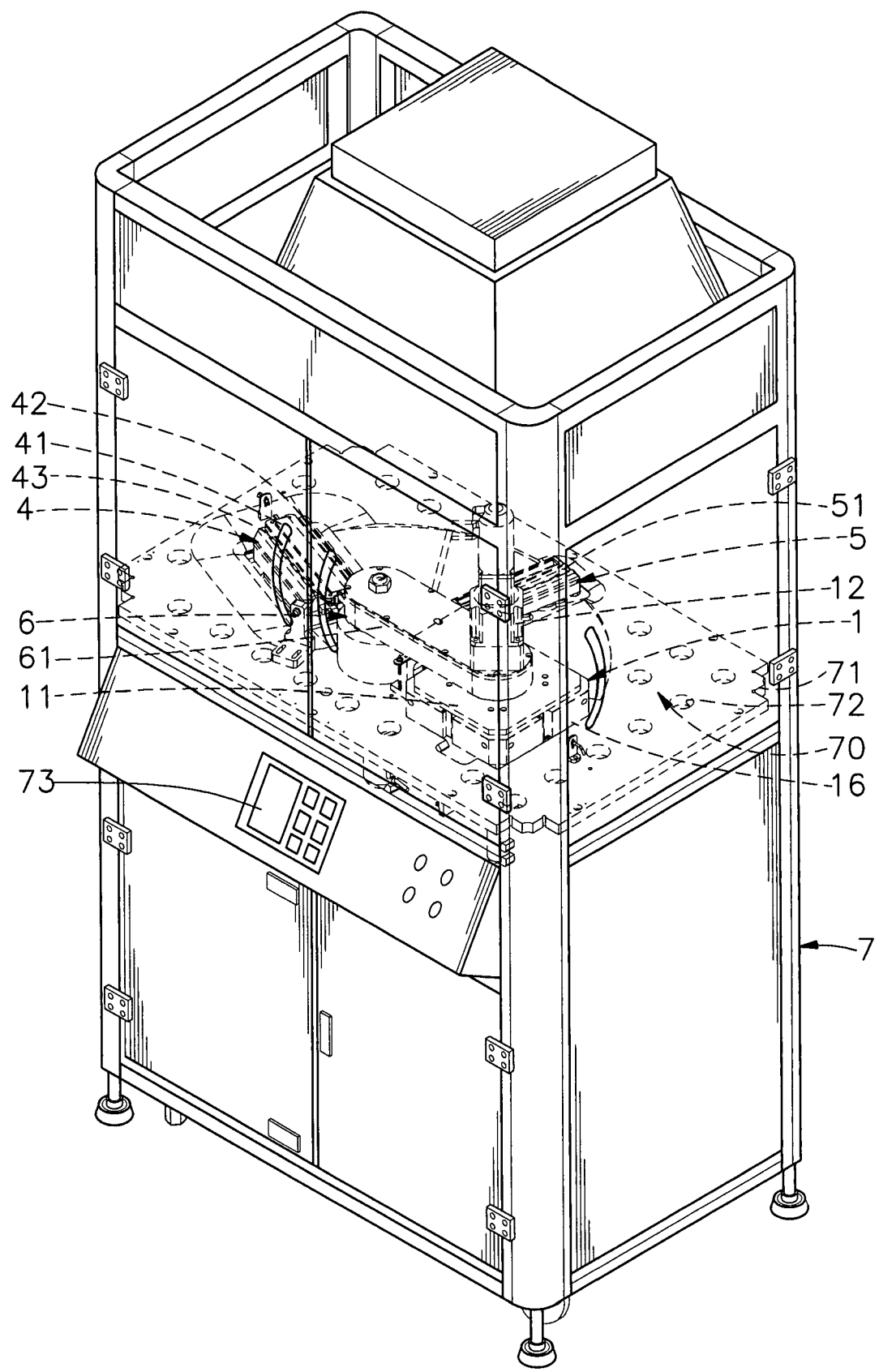
FIG. 5 is a perspective view of a photomask cleaner according to the present invention.
Figure 6:
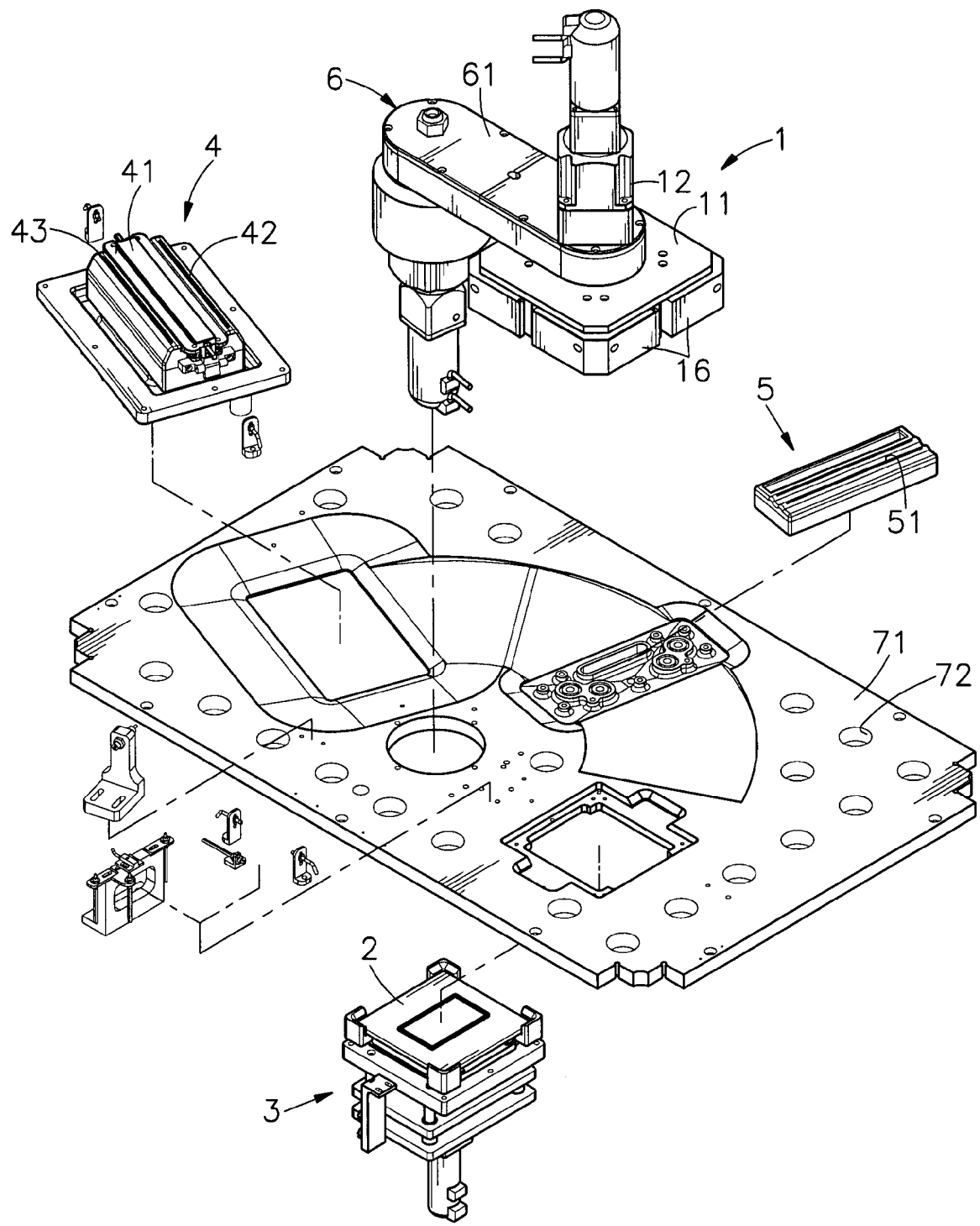
FIG. 6 is an exploded view of a part of the photomask cleaner according to the present invention.
Figure 7:
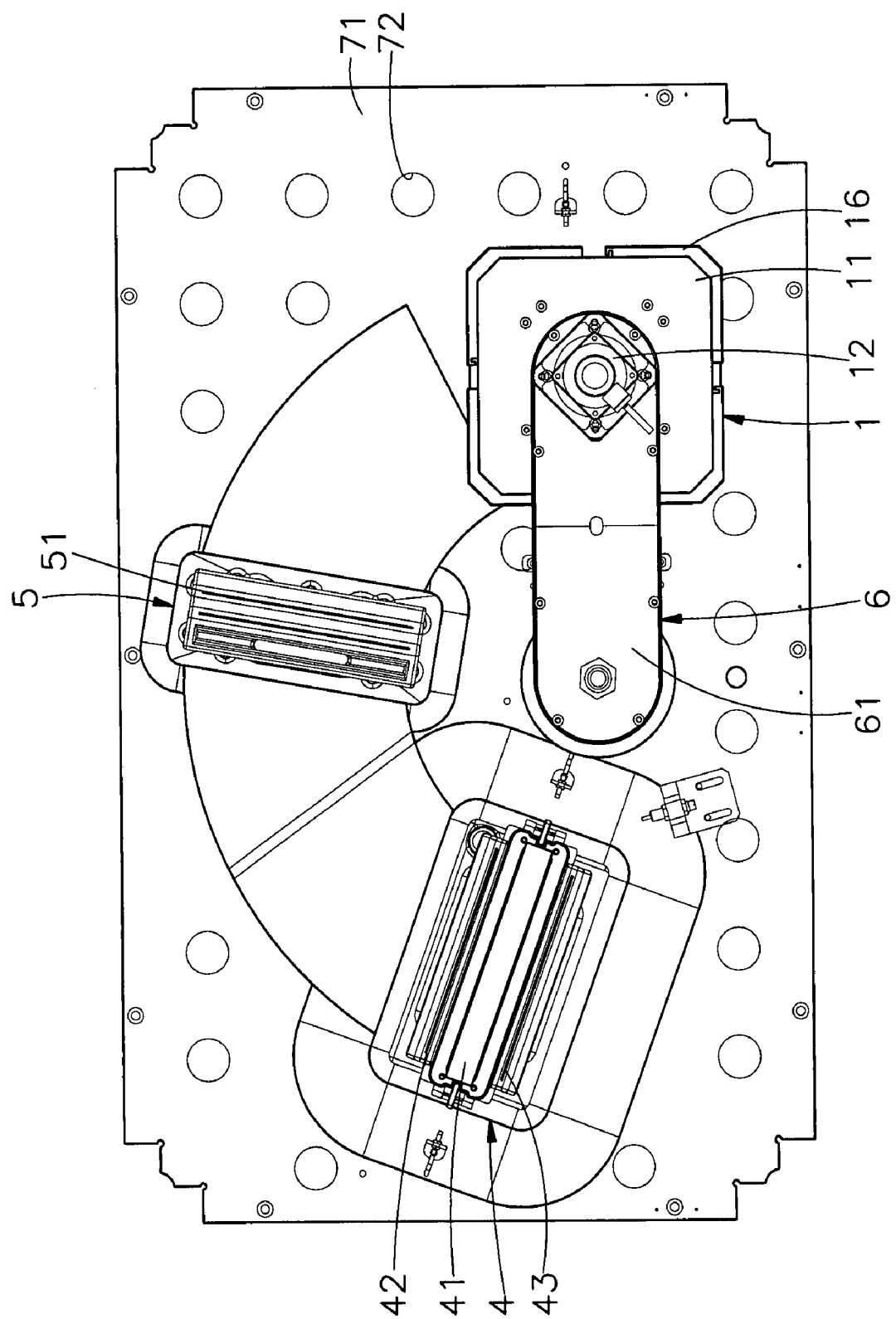
FIG. 7 is a schematic drawing showing the photomask cleaning action of the photomask cleaner according to the present invention (I).
Figure 8:
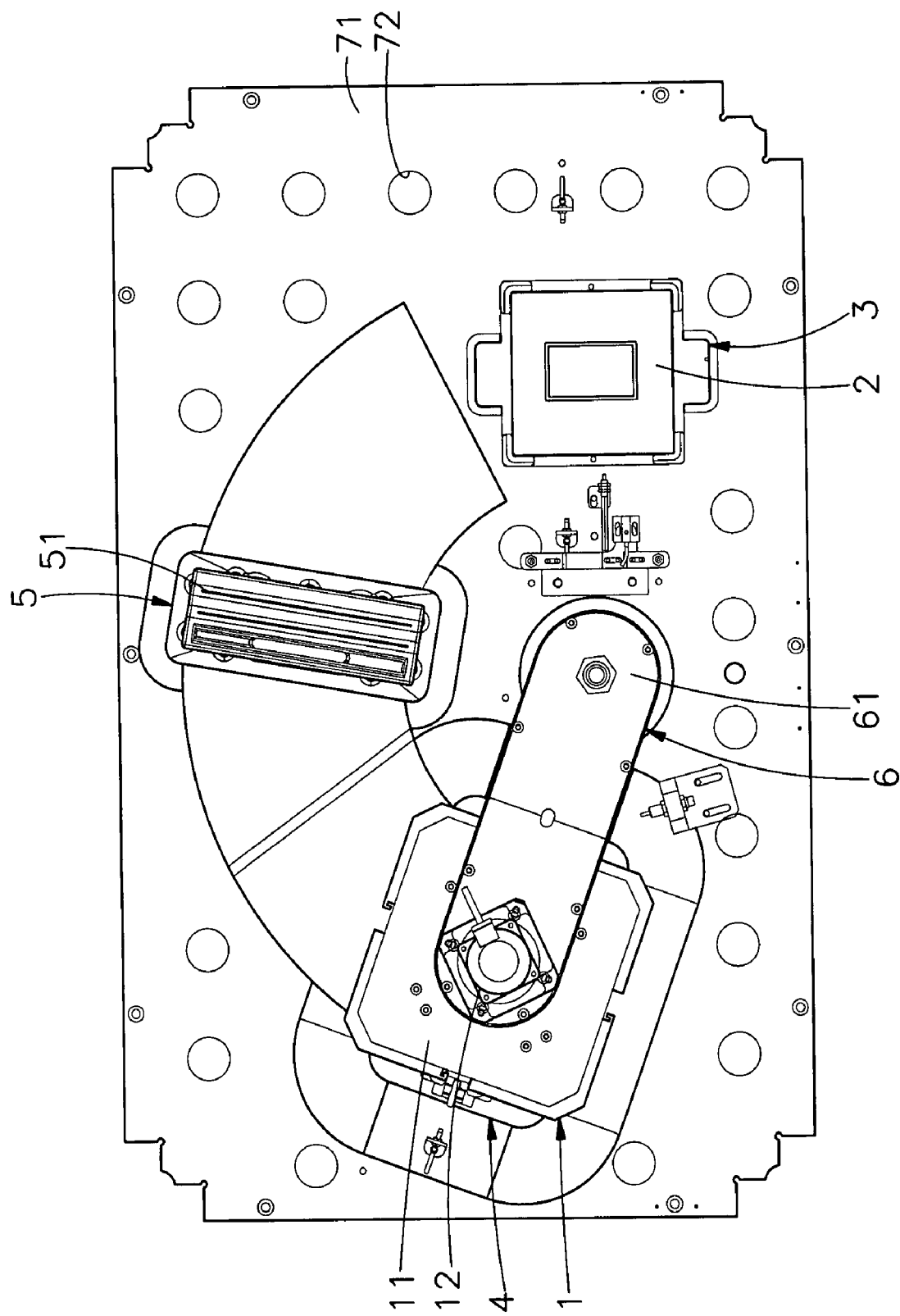
FIG. 8 is a schematic drawing showing the photomask cleaning action of the photomask cleaner according to the present invention (II).
Figure 9:
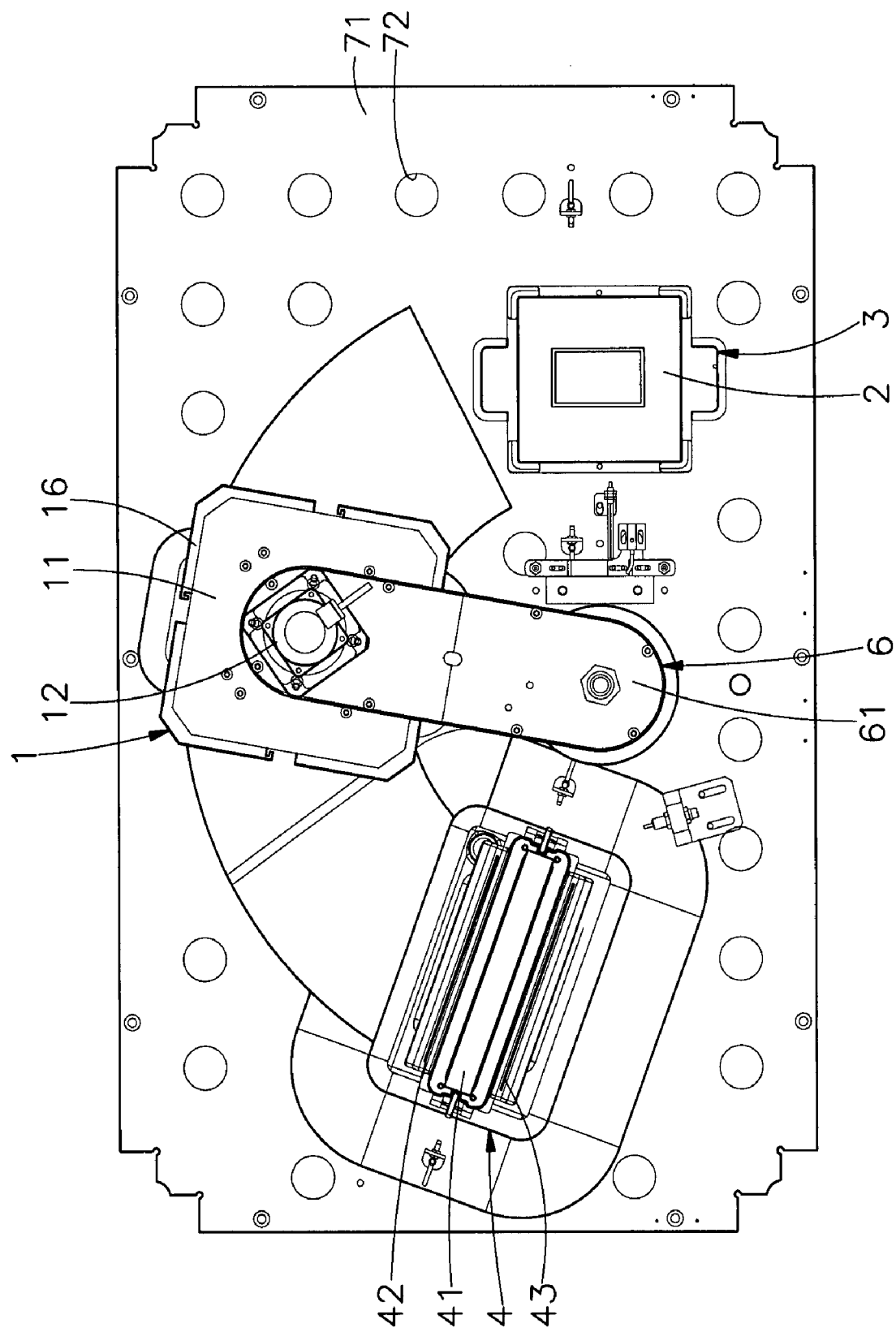
FIG. 9 is a schematic drawing showing the photomask cleaning action of the photomask cleaner according to the present invention (III).

Referring to FIGS. 5 and 6, the photomask cleaner further comprises a chamber 7. The chamber 7 operated between an opened status and an enclosed airtight status comprises an enclosed air chamber 70, a worktable 71 at the bottom side of the enclosed air chamber 70, an air circulation system 72 for causing circulation of clean air through the enclosed air chamber 70, an air dryer 5, and a control panel 73 on the outside of the chamber 7. The aforesaid clamp assembly 1 and the displacement mechanism 6 are installed in the worktable 71 inside the chamber 7. The air circulation system 72 supplies downward flows of clean air toward the worktable 71 at predetermined angles and draws foul air out of the enclosed air chamber 70. The air dryer 5 uses clean air to dry the cleaned photomask 2. Through the control panel 73, a user can set the number of photomask cleaning times and the operating time of the air dryer 5.

Referring to FIGS. 6~9, the photomask cleaner further comprises a photomask lifter 3 and a cleaning unit 4 installed in the aforesaid chamber 7. The cleaning unit 4 comprises a wiper 41, a set of spray nozzles 42, and a drain hole 43 for drainage of the washing fluid. The photomask 2 to be cleaned is put on the photomask lifter 3 in a standby position, and then the photomask lifter 3 is operated to lift the photomask 2 to a clamping position, and then the clamp assembly 1 is operated to move the clamping plates 16 to the received position where the clamping plates 16 clamp the photomask 2 in the clamping position. Thereafter, the displacement mechanism 6 is operated to move the clamp assembly 1, thereby carrying the photomask 2 to the cleaning unit 4, the air dryer 5 and the photomask lifter 3 step by step subject to pre-set time intervals. When the photomask 2 is carried to the cleaning unit 4, the cleaning unit 4 is operated to spray a cleaning fluid through the spray nozzles 42 to clean the photomask 2, and at the same time the suspension arm 61 of the displacement mechanism 6 is operated to move the clamp assembly 1 horizontally back and forth several times relative to the cleaning unit 4. After fluid cleaning subject to the settings, the wiper 41 of the cleaning unit 4 is operated to wipe clean the photomask 2, and then the displacement mechanism 6 is operated to carry the clamp assembly 1 to the air dryer 5, and the air dryer 5 is then operated to blow clean air through at least one air nozzle 51 toward the photomask 2 at a predetermined angle that is not perpendicular to the photomask 2, thereby drying the cleaned photomask 2. Thereafter, the displacement mechanism 6 is operated to carry the clamp assembly 1 and the photomask 2 to the photomask lifter 3, and then the clamp assembly 1 is operated to release the photomask 2, enabling the user to pick up the well-cleaned photomask 2 from the photomask lifter 3.

The clean air supplied through the air circulation system 72 can be an inert gas, dry cold air, nitrogen gas or pure air. The aforesaid rotary driving device 12 can be a rotary pneumatic cylinder, induction motor, step motor, reducing gearbox, or servomotor. The aforesaid elastic buffer device 17 can be formed with one single piece member of high elasticity. Alternatively, the elastic buffer device 17 can be formed with a plurality of elastic members. The cleaning fluid provided by the cleaning unit 4 can be deionized water. The wiper 41 of the cleaning unit 4 can be a clean room wiper.

As stated above, the invention provides a photomask cleaner, which has the following features and benefits:

1. An elastic buffer device 17 is fastened to the clamping plates 16 for touching the photomask 2 to be cleaned to lower the impact on the photomask 2 when the clamping plates 16 clamp the photomask 2. Therefore, the clamping plates 16 can secure the photomask 2 firmly without causing a significant impact.

2. By means of the clamping plates 16, the clamp assembly 1 holds the photomask 2 positively for cleaning, and the photomask 2 will not fall from the clamping plates 16 in case of a power failure during the cleaning operation.

3. The invention uses the cleaning unit 4 to clean the loaded photomask 2 and the air dryer 5 to dry the well-cleaned photomask 2 automatically, and therefore it is not necessary to remove the pellicle from the loaded photomask 2 during the cleaning operation.

4. The invention uses the air circulation system 72 to cause circulation of a clean air through the enclosed air chamber 70 and to carry foul air away from the enclosed air chamber 70. Through the control panel 73, the user can sets the number of photomask cleaning times and the operating time of the air dryer 5.

Although particular embodiments of the invention have been described in detail for purposes of illustration, various modifications and enhancements may be made without departing from the spirit and scope of the invention.

What the invention claimed is:

1. A photomask cleaner comprising:
   a chamber operably set between an opened status and an enclosed airtight status;
   a worktable provided inside said chamber, said worktable carrying a plurality of workstations;

a photomask lifter mounted inside said chamber and operable to move a photomask vertically between a standby position and a clamping position;

a clamp assembly mounted in said chamber and controllably to pick up said photomask from said clamping position;

a displacement mechanism mounted in said chamber and controllable to move said clamp assembly among said workstations and said clamping position subject to a predetermined track;

at least one cleaning unit installed in at least one of said workstations for cleaning said photomask carried by said clamp assembly and it is not necessary to remove a pellicle from said photomask during the cleaning operation, said at least one cleaning unit each comprising a plurality of spray nozzles controllable to spray a cleaning fluid to clean said photomask carried by said clamp assembly, a drain hole for drainage of the cleaning fluid, and a wiper for wiping clean said photomask carried by said clamp assembly;

at least one air dryer installed in at least one of said workstations for drying said photomask carried by said clamp assembly with air; and a air circulation system installed in said chamber and controllable to supply a clean gas in said chamber and to carry foul air out of said chamber.

2. The photomask cleaner as claimed in claim 1, wherein the cleaning fluid sprayed through said spray nozzles is deionized water.

3. The photomask cleaner as claimed in claim 1, wherein said wiper is a clean room wiper.

4. The photomask cleaner as claimed in claim 1, wherein the clean gas supplied by said air circulation system is one of an inert gas, dry cold air, nitrogen gas, pure air and their combination.

5. The photomask cleaner as claimed in claim 1, wherein said at least one air dryer each is respectively controllable to output a air flow toward said photomask carried by said clamp assembly at a predetermined angle that is not perpendicular to said photomask.

6. The photomask cleaner as claimed in claim 1, wherein said air circulation system is controllable to supply a clean gas downwardly toward said clamp assembly and said worktable at a predetermined angle.

7. A clamp assembly for use in a photomask cleaner to clamp a photomask for cleaning, comprising a holder base, said holder base comprising a receiving portion and at least two pairs of through holes in communication with said receiving portion;

a rotary driving device accommodated in said receiving portion of said holder base;

a plurality of connecting members suspending in said receiving portion of said holder base and equiangularly spaced around said rotary driving device;

a plurality of pairs of actuating rods respectively connected to two distal ends of each of said connecting members and respectively movably inserted through said through holes of said holder base to the outside of said holder base;

a plurality of links, said links each having a first end respectively tangentially pivoted to said rotary driving device and a second end respectively pivotally coupled to a midpoint of each of said connecting members;

a plurality of clamping plates respectively connected to said pairs of actuating rods outside said holder base and movable with said actuating rods to clamp a photomask, and an elastic buffer device fastened to said clamping plates for touching said photomask to be clamped by said clamping plates.

8. The clamp assembly as claimed in claim 7, wherein said elastic buffer device is formed with a single piece member of high elasticity.

9. The clamp assembly as claimed in claim 7, wherein said elastic buffer device is comprised of a plurality of elastic members.

10. The clamp assembly as claimed in claim 7, wherein said rotary driving device is selected from one of rotary pneumatic cylinder, induction motor, step motor, reducing gearbox and servomotor.

11. A photomask cleaner comprising:

a worktable, said worktable carrying a plurality of workstations;

a photomask lifter operable to move a photomask vertically between a standby position and a clamping position;

a clamp assembly mounted in said chamber and controllably to pick up said photomask from said clamping position;

a displacement mechanism mounted in said worktable and controllable to move said clamp assembly among said workstations and said clamping position subject to a predetermined track;

at least one cleaning unit installed in at least one of said workstations for cleaning said photomask carried by said clamp assembly and it is not necessary to remove a pellicle from said photomask during the cleaning operation, said at least one cleaning unit each comprising a plurality of spray nozzles controllable to spray a cleaning fluid to clean said photomask carried by said clamp assembly, a drain hole for drainage of the cleaning fluid, and a wiper for wiping clean said photomask carried by said clamp assembly; and at least one air dryer installed in at least one of said workstations for drying said photomask carried by said clamp assembly with a clean gas.

12. The photomask cleaner as claimed in claim 11, wherein the cleaning fluid sprayed through said spray nozzles is deionized water.

13. The photomask cleaner as claimed in claim 11, wherein said wiper is a clean room wiper.

14. The photomask cleaner as claimed in claim 11, wherein the clean gas supplied by said at least one air dryer is one of an inert gas, dry cold air, nitrogen gas, pure air and their combination.

15. The photomask cleaner as claimed in claim 11, wherein said at least one air dryer each is respectively controllable to output a air flow toward said photomask carried by said clamp assembly at a predetermined angle that is not perpendicular to said photomask.

* * * * *